(12) United States Patent
Kuribayashi et al.

(10) Patent No.: US 9,508,531 B2
(45) Date of Patent: Nov. 29, 2016

(54) METHOD OF MANUFACTURING SEMICONDUCTOR DEVICE BY ALTERNATIVELY INCREASING AND DECREASING PRESSURE OF PROCESS CHAMBER

(71) Applicant: Hitachi Kokusai Electric Inc., Tokyo (JP)

(72) Inventors: Koei Kuribayashi, Toyama (JP); Shinya Ebata, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 136 days.

(21) Appl. No.: 14/495,226

(22) Filed: Sep. 24, 2014

(65) Prior Publication Data

US 2015/0087159 A1 Mar. 26, 2015

(30) Foreign Application Priority Data

Sep. 26, 2013 (JP) ................................. 2013-200118

(51) Int. Cl.
| | | |
|---|---|---|
| C23C 16/455 | (2006.01) | |
| H01J 37/32 | (2006.01) | |
| C23C 16/40 | (2006.01) | |
| H01L 21/02 | (2006.01) | |

(52) U.S. Cl.
CPC ....... *H01J 37/32449* (2013.01); *C23C 16/401* (2013.01); *C23C 16/45527* (2013.01); *C23C 16/45546* (2013.01); *H01J 37/32926* (2013.01); *H01L 21/0228* (2013.01); *H01L 21/02164* (2013.01); *H01L 21/02211* (2013.01); *H01L 21/02274* (2013.01); *H01J 2237/332* (2013.01)

(58) Field of Classification Search
CPC .................. C23C 16/45525; C23C 16/45527; C23C 16/45534
See application file for complete search history.

(56) References Cited

U.S. PATENT DOCUMENTS

| | | | |
|---|---|---|---|
| 6,171,104 B1 | 1/2001 | Saito et al. | |
| 6,478,872 B1* | 11/2002 | Chae ................ | C23C 16/45548 117/105 |
| 2003/0106490 A1* | 6/2003 | Jallepally ......... | C23C 16/45521 117/89 |

(Continued)

FOREIGN PATENT DOCUMENTS

| | | |
|---|---|---|
| JP | 2000-058543 A | 2/2000 |
| JP | 2009-182286 A | 8/2009 |

(Continued)

OTHER PUBLICATIONS

Aarik, Jaan, et al., "Influence of carrier gas pressure and flow rate on atomic layer deposition of HfO2 and ZrO2 thin films". Applied Surface Science 252 (2006) 5723-5734.*

(Continued)

*Primary Examiner* — Bret Chen
(74) *Attorney, Agent, or Firm* — Volpe and Koenig, P.C.

(57) ABSTRACT

The method of the present invention is related to a technique of efficiently purging source gases remaining on a substrate and improving in-plane uniformity of a substrate. The method of the present invention includes forming a thin film on a substrate accommodated in a process chamber by (a) supplying a source gas into the process chamber, and (b) supplying an inert gas into the process chamber while alternately increasing and decreasing a flow rate of the inert gas supplied into the process chamber and exhausting the source gas and the inert gas from the process chamber.

9 Claims, 7 Drawing Sheets

(56) References Cited

U.S. PATENT DOCUMENTS

| | | | |
|---|---|---|---|
| 2005/0016956 A1* | 1/2005 | Liu | C23C 16/4412 216/67 |
| 2006/0045970 A1* | 3/2006 | Seo | C23C 16/45544 427/248.1 |
| 2006/0165890 A1* | 7/2006 | Kaushal | C23C 16/45527 427/248.1 |
| 2006/0176928 A1* | 8/2006 | Nakamura | H01L 21/6719 373/60 |
| 2007/0239375 A1* | 10/2007 | Kaushal | C23C 16/52 702/81 |
| 2008/0264337 A1* | 10/2008 | Sano | C23C 16/4408 118/704 |
| 2011/0076789 A1* | 3/2011 | Kuroda | H01L 21/266 438/14 |
| 2015/0004798 A1* | 1/2015 | Chandrasekharan | H01L 21/67017 438/758 |
| 2015/0155201 A1* | 6/2015 | Sato | H01L 21/76838 438/680 |

FOREIGN PATENT DOCUMENTS

| | | |
|---|---|---|
| KR | 10-2010-0027965 A | 3/2010 |
| KR | 10-2010-0094408 A | 8/2010 |

OTHER PUBLICATIONS

Liu, Xinye, et al., "ALD of Hafnium Oxide Thin Films from Tetrakis(ethylmethylamino)hafnium and Ozone". Journal of the Electrochemical Society, 152 (3) G213-G219 (2005).*

Kim, Joon Rae, et al., "Effects of Tris(tert-pentoxy)silanol Purge Time on SiO2 Thin-Film Growth Rate in Rapid Atomic Layer Deposition". ECS Solid State Letters, 2 (10) p. 91-p. 93 (2013).*

Dingemans, G., et al., "Plasma-Assisted Atomic Layer Deposition of Low Temperature SiO2". ECS Transactions, 35 (4) 191-204 (2011).*

* cited by examiner

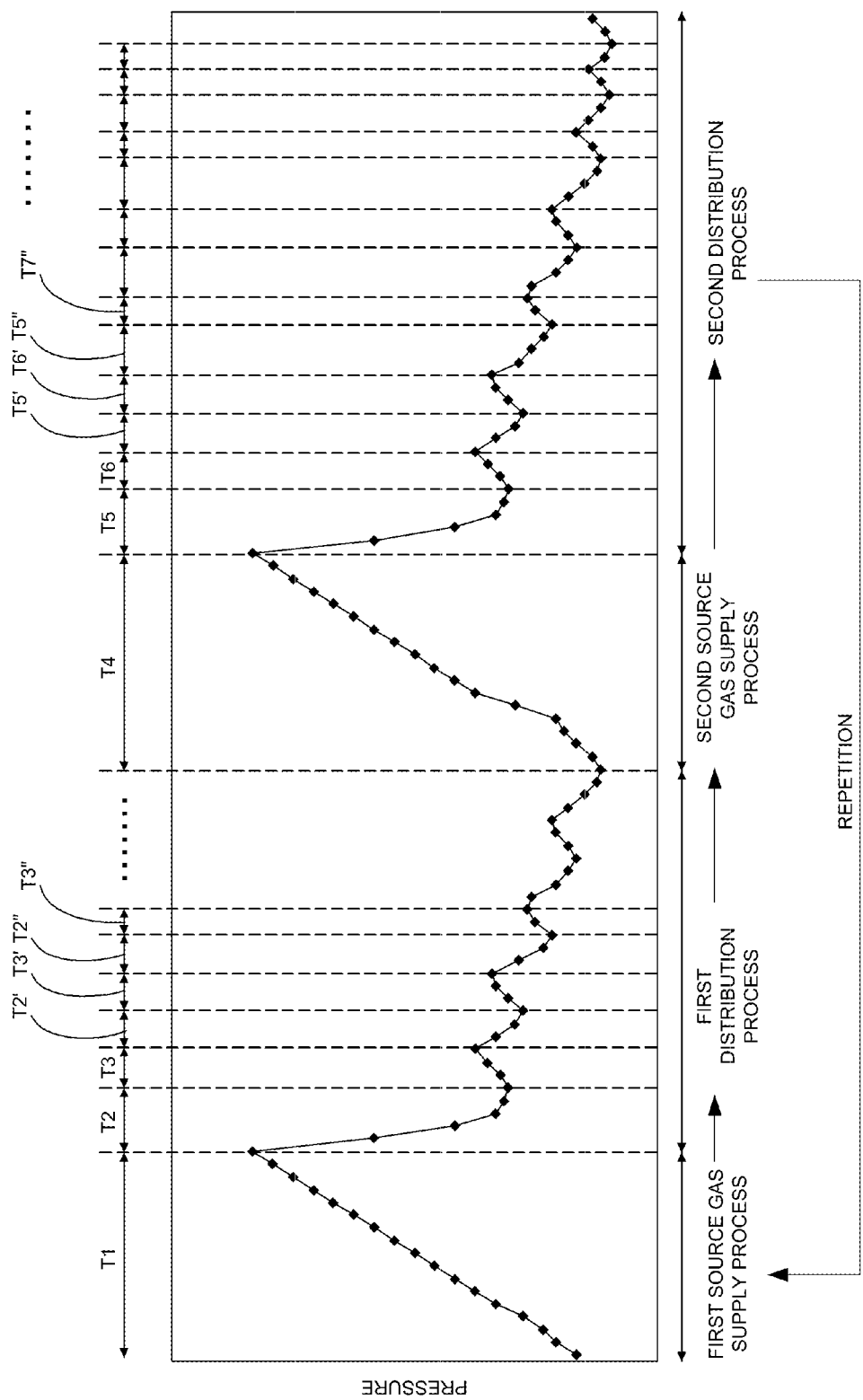

METHOD OF MANUFACTURING SEMICONDUCTOR DEVICE BY ALTERNATIVELY INCREASING AND DECREASING PRESSURE OF PROCESS CHAMBER

CROSS-REFERENCE TO RELATED PATENT APPLICATION

This U.S. non-provisional patent application claims priority under 35 U.S.C. §119 of Japanese Patent Application No. 2013-200118, filed on Sep. 26, 2013, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device and a non-transitory computer readable recording medium, and more particularly, to a technique of improving purge efficiency.

2. Description of the Related Art

In recent years, the scaling-up of a processing substrate has markedly progressed in the manufacture of a semiconductor substrate, a liquid crystal substrate, or an electroluminescent (EL) substrate. For example, a semiconductor substrate having a diameter of about 450 mm has been put to practical use. Also, miniaturization has progressed, and improving in-plane uniformity (e.g., a film thickness or composition) in a thin film formed on a substrate (wafer) has been increasingly required. As a conventional technique for deriving an improvement in the in-plane uniformity of a substrate, for example, there is a technique described in Patent document 1.

1. Japanese Patent Laid-open No. 2009-182286

SUMMARY OF THE INVENTION

When a film forming process is performed on a substrate having a large diameter using a conventional technique of forming a film using a surface reaction by alternately supplying a plurality of types of source gases onto the substrate, during the removal of the source gases from a substrate process chamber, the source gases are not sufficiently removed but remain in the vicinity of a center of the substrate. As a result, in-plane uniformity of the substrate is degraded.

It is a main object of the present invention to provide a technique of efficiently removing a source gas remaining on a substrate and improving in-plane uniformity of the substrate to solve the above-described problems.

According to one aspect of the present invention, there is provided a method of manufacturing a semiconductor device, including: forming a thin film on a substrate accommodated in a process chamber by (a) supplying a source gas into the process chamber, and (b) supplying an inert gas into the process chamber while alternately increasing and decreasing a flow rate of the inert gas supplied into the process chamber and exhausting the source gas and the inert gas from the process chamber.

According to another aspect of the present invention, there is provided a substrate processing apparatus including:

a process chamber configured to process a substrate;

a source gas supply system configured to supply a source gas into the process chamber;

an inert gas supply system configured to supply an inert gas into the process chamber; and a controller configured to control the source gas supply system and the inert gas supply system to supply the inert gas into the process chamber while alternately increasing and decreasing a flow rate of the inert gas supplied into the process chamber and exhaust the source gas and the inert gas from the process chamber after supplying the source gas into the process chamber.

According to another aspect of the present invention, there is provided a non-transitory computer readable recording medium causing a computer to perform, to form a thin film on a substrate accommodated in a process chamber: (a) supplying a source gas into the process chamber; and (b) supplying an inert gas into the process chamber while alternately increasing and decreasing a flow rate of the inert gas supplied into the process chamber and exhausting the source gas and the inert gas from the process chamber.

BRIEF DESCRIPTION OF THE DRAWINGS

FIG. 7 is a diagram illustrating opening/closing times of an APC valve, purge times in the first and second distribution processes, and variations in pressure according to another exemplary embodiment of the present invention.

DETAILED DESCRIPTION OF THE PREFERRED EMBODIMENTS (1) First Embodiment

One embodiment of the present invention will now be described with reference to the accompanying drawings.

(1) First Embodiment

Hereinafter, one embodiment of the present invention, a first embodiment, will be described with reference to the appended drawings. A substrate processing apparatus according to the present embodiment is configured as one example of a substrate processing apparatus used to manufacture semiconductor devices [integrated circuits (ICs)].

Figure 1:
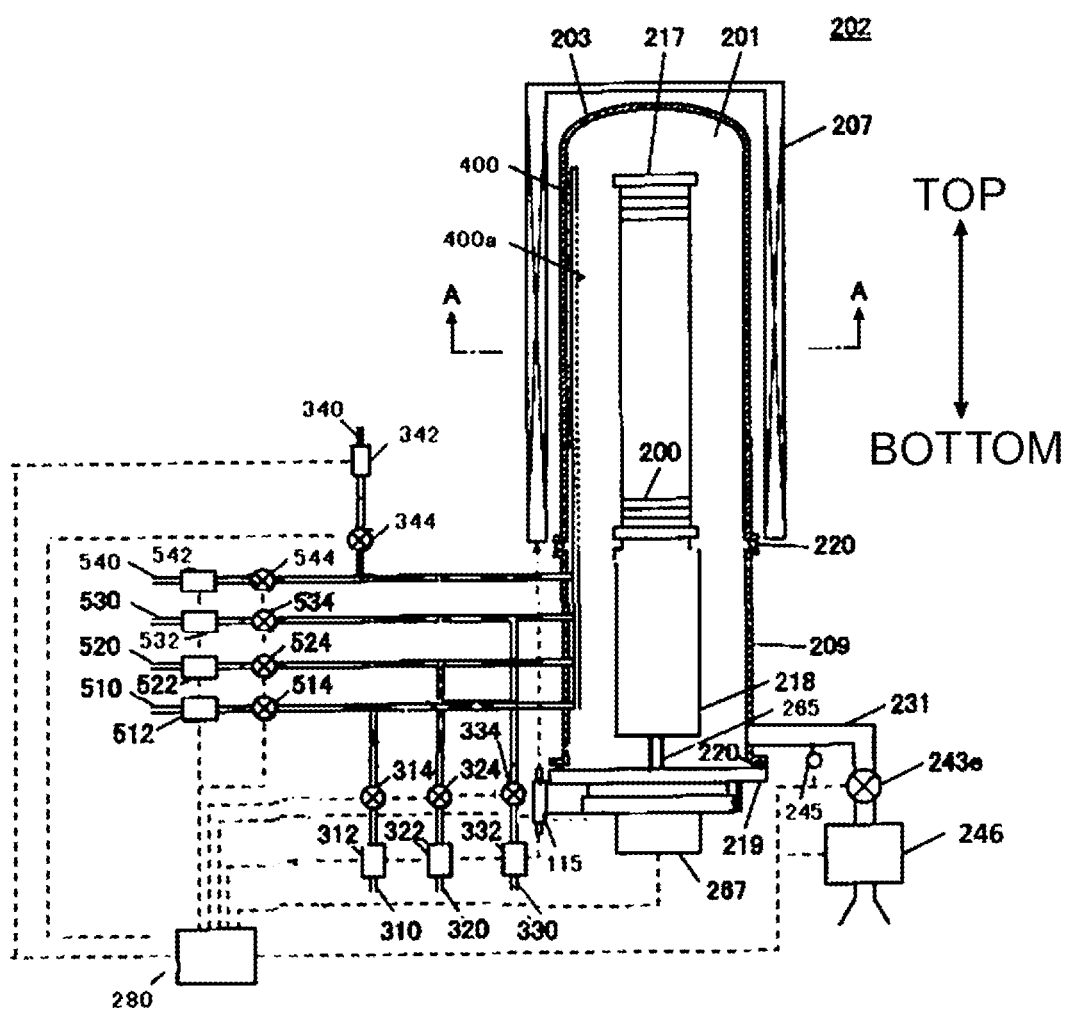
FIG. 1 is a schematic configuration diagram of a longitudinal processing furnace and members annexed thereto of a substrate processing apparatus preferably used in an exemplary embodiment of the present invention, which is a longitudinal sectional view of a portion of the processing furnace.
Figure 2:
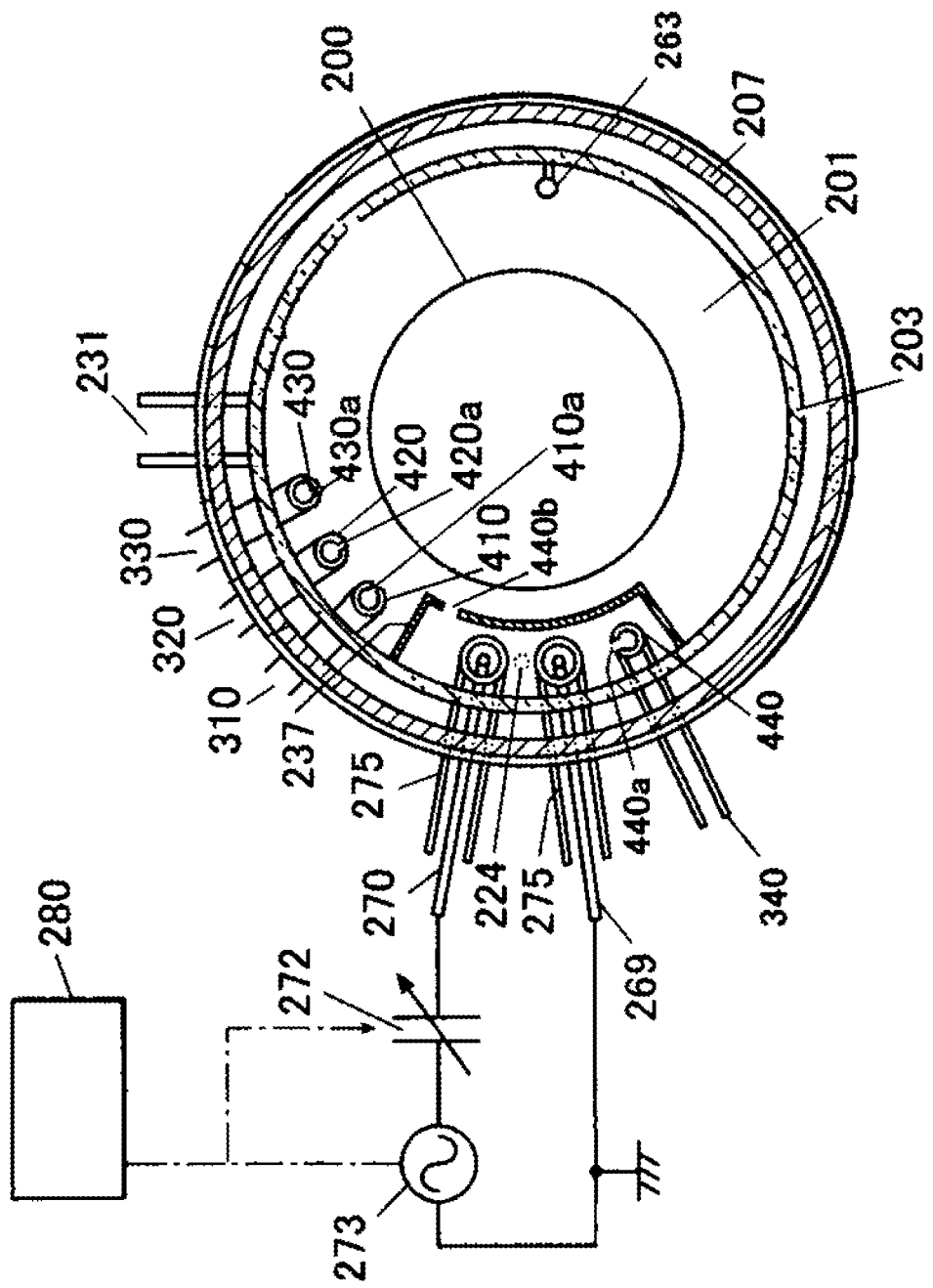
FIG. 2 is a schematic configuration diagram of a longitudinal processing furnace and members annexed thereto of a substrate processing apparatus preferably used in an exemplary embodiment of the present invention, which is taken along line A-A of FIG. 1.

As shown in FIGS. 1 and 2, a heater 207 which is a heating unit (heating mechanism or heating system) for heating a wafer 200 is installed at a process furnace 202. The heater 207 includes an insulating member having a cylindrical shape with a closed upper portion and a plurality of heater wires, and has a unit configuration in which the heater wires are installed in the insulating member. In the heater 207, a reaction tube 203 forming a reaction container (process container) in a concentric shape with the heater 207 is provided. The reaction tube 203 is formed of a heat-resistant material, e.g., quartz ($SiO_2$) or silicon carbide (SiC), and has a cylindrical shape, an upper end of which is closed and a lower end of which is open.

A manifold 209 formed of such as stainless steel is installed via an O-ring 220 serving as a seal member below the reaction tube 203. A lower end aperture of the manifold 209 is air-tightly closed by a seal cap 219 serving as a lid via the O-ring 220. In the process furnace 202, a process chamber 201 is formed by at least the reaction tube 203, the manifold 209 and the seal cap 219.

A boat support table 218 for supporting a boat 217 serving as a substrate support member which is a substrate support means [substrate support portion] is installed at the seal cap 219. A plurality of wafers 200 are retained by the boat 217. The plurality of wafers 200 are retained a predetermined distance apart from one another in a horizontal posture and supported by the boat 217. The boat 217 is configured to be capable of moving upward/downward (being loaded/unloaded) into/from the reaction tube 203 using a boat elevator 115 serving as a transfer unit (transfer mechanism). A boat rotating mechanism 267 configured to rotate the boat 217 is installed at a lower end portion of the boat support table 218 configured to support the boat 217 to improve processing uniformity. The boat 217 supported by the boat support table 218 may be rotated by driving the boat rotating mechanism 267.

In the process furnace 202, while the plurality of wafers 200 to be batch-processed are being stacked in multiple stages in the boat 217, the boat 217 is supported by the boat support table 218 and inserted into the process chamber 201, and the heater 207 is configured to heat the wafer 200 inserted into the process chamber 201 to a predetermined temperature.

As shown in FIGS. 1 and 2, four gas supply pipes [a first gas supply pipe 310, a second gas supply pipe 320, a third gas supply pipe 330, and a fourth gas supply pipe 340] for supplying source gases are connected to the process chamber 201.

A mass flow controller (MFC) 312 which is a flow rate control device (flow rate control unit) and a valve 314 which is an opening/closing valve are sequentially installed at the gas supply pipe 310 from an upstream side. A nozzle 410 [a first nozzle 410] is connected to a front end portion of the gas supply pipe 310. The nozzle 410 is configured as an L-shaped long nozzle, and includes a horizontal portion passing through sidewalls of the manifold 209. A vertical portion of the nozzle 410 is installed in an arc-shaped space between inner walls of the reaction tube 203 and the wafers 200 to move upward from lower inner walls of the reaction tube 203 in a direction in which the wafers 200 are stacked [i.e., move upward from one end side of a wafer arrangement region to the other end side thereof]. In other words, the nozzle 410 is installed along the wafer arrangement region in which the wafers 200 are arranged, in a region that horizontally surrounds the wafer arrangement region at sides of the wafer arrangement region. A plurality of gas supply holes 410a are installed in a side surface of the nozzle 410 to supply a gas. The gas supply holes 410a open toward a center of the reaction tube 203 to supply a gas toward the wafers 200. The gas supply holes 410a are formed from a lower portion of the reaction tube 203 to an upper portion thereof and each has the same opening area or gradient opening area at the same opening pitch.

A first gas supply system is mainly configured by the gas supply pipe 310, the MFC 312, the valve 314, and the nozzle 410 (first nozzle).

Also, a carrier gas supply pipe 510 for supplying a carrier gas is connected to the gas supply pipe 310. An MFC 512 and a valve 514 are installed at the carrier gas supply pipe 510. A first carrier gas supply system (first inert gas supply system) is mainly configured by the carrier gas supply pipe 510, the MFC 512, and the valve 514.

An MFC 322 which is a flow rate control device (flow rate control unit) and a valve 324 which is an opening/closing valve are sequentially installed at the gas supply pipe 320 from an upstream side. A nozzle 420 (second nozzle) is connected to a front end portion of the gas supply pipe 320. Similar to the nozzle 410, the nozzle 420 is configured as an L-shaped long nozzle, and includes a horizontal portion passing through the sidewalls of the manifold 209. A vertical portion of the nozzle 420 is installed in an arc-shaped space between the inner walls of the reaction tube 203 and the wafers 200 to move upward from lower inner walls of the reaction tube 203 in a direction in which the wafers 200 are stacked [i.e., move upward from one end side of a wafer arrangement region to the other end side thereof]. A plurality of gas supply holes 420a are installed in a side surface of the nozzle 420 to supply a gas. Similar to the gas supply holes 410a, the gas supply holes 420a are formed from the lower portion of the reaction tube 203 to the upper portion thereof and each has the same opening area or gradient opening area at the same opening pitch.

A second gas supply system is mainly configured by the gas supply pipe 320, the MFC 322, the valve 324, and the nozzle 420.

Also, a carrier gas supply pipe 520 for supplying a carrier gas is connected to the gas supply pipe 320. An MFC 522 and a valve 524 are installed at the carrier gas supply pipe 520. A second carrier gas supply system (second inert gas supply system) is mainly configured by the carrier gas supply pipe 520, the MFC 522, and the valve 524.

An MFC 332 which is a flow rate control device (flow rate control unit) and a valve 334 which is an opening/closing valve are sequentially installed at the gas supply pipe 330 from an upstream side. A nozzle 430 is connected to a front end portion of the gas supply pipe 330. The nozzle 430 is configured as an L-shaped long nozzle similar to the nozzle 430, and includes a horizontal portion passing through the sidewalls of the manifold 209. A vertical portion of the nozzle 430 is installed in an arc-shaped space between the inner walls of the reaction tube 203 and the wafers 200 to move upward from lower inner walls of the reaction tube 203 in a direction in which the wafers 200 are stacked [i.e., move upward from one end side of a wafer arrangement region to the other end side thereof]. A plurality of gas supply holes 430a are installed in a side surface of the nozzle 430 to supply a gas. Similar to the gas supply holes 410a, the gas supply holes 430a are formed from a lower portion of the reaction tube 203 to an upper portion thereof and each has the same opening area or gradient opening area at the same opening pitch.

A third gas supply system is mainly configured by the gas supply pipe 330, the MFC 332, the valve 334, and the nozzle 430 (third nozzle).

Also, a carrier gas supply pipe 530 for supplying a carrier gas is connected to the gas supply pipe 330. An MFC 532 and a valve 534 are installed at the carrier gas supply pipe 530. A third carrier gas supply system (third inert gas supply system) is mainly configured by the carrier gas supply pipe 530, the MFC 532, and the valve 534.

An MFC 342 which is a flow rate control device (flow rate control unit) and a valve 344 which is an opening/closing valve are sequentially installed at the gas supply pipe 340 from an upstream side. A nozzle 440 is connected to a front end portion of the gas supply pipe 340. A fourth gas supply system is mainly configured by the gas supply pipe 340, the MFC 342, the valve 344, and the nozzle 440 (fourth nozzle).

Also, a carrier gas supply pipe 540 for supplying a carrier gas is connected to the gas supply pipe 340. An MFC 542 and a valve 544 are installed at the carrier gas supply pipe 540. A fourth carrier gas supply system (fourth inert gas supply system) is mainly configured by the carrier gas supply pipe 540, the MFC 542, and the valve 544.

A buffer chamber 237 which is a gas dispersing space is installed in an arc-shaped space between inner walls of the reaction tube 203 constituting the process chamber 201 and the wafers 200 to move from lower inner walls of the reaction tube 203 to upper inner walls thereof in a direction in which the wafers 200 are stacked. In other words, the nozzle 410 is installed along the wafer arrangement region in which the wafers 200 are arranged, in a region that horizontally surrounds the wafer arrangement region at sides of the wafer arrangement region. The buffer chamber 237 is formed by the inner walls of the reaction tube 203 and a buffer chamber wall 247, and gas supply holes 440b which are supply holes for supplying gases are installed in an end portion of the buffer chamber wall 247 adjacent to the wafer 200. The gas supply holes 440b open toward a center of the reaction tube 203. The gas supply holes 440b are formed from the lower portion of the reaction tube 203 to the upper portion thereof and each has the same opening area at the same opening pitch.

The nozzle 440 is installed at an end portion opposite to the end portion of the buffer chamber 237 in which the gas supply holes 440b are installed, and disposed from a lower portion of the reaction tube 203 to an upper portion thereof in a direction in which the wafers 200 are stacked. Also, gas supply holes 440a which are supply holes for supplying a plurality of gases are installed in the nozzle 440. While the gas supply holes 440a each may have the same opening area at the same opening pitch from an upstream side of gases to a downstream side thereof when there is a small difference in pressure between the buffer chamber 237 and the process chamber 201, the gas supply holes 440a may have gradually increasing opening areas or gradually decreasing opening pitches from the upstream side of gases to the downstream side thereof when there is a large difference in pressure between the buffer chamber 237 and the process chamber 201.

As an example of the above-described configuration, hexachlorodisilane (HCDS, $Si_2Cl_6$) which is a silicon-containing source containing a silicon element as a source gas serving as a first process gas containing a first element is supplied through the gas supply pipe 310 via the valve 314 and the nozzle 410 into the process chamber 201. Also, when a liquid material (e.g., $Si_2Cl_6$) which is in liquid state at room temperature and under atmospheric pressure is used, the liquid material is vaporized by a vaporization system, such as a vaporizer or a bubbler, and then used. That is, when $Si_2Cl_6$ is used as a silicon-containing source, $Si_2Cl_6$ is vaporized by the vaporization system, such as the vaporizer or the bubbler, and supplied as a $Si_2Cl_6$ gas serving as a silicon-containing gas into the process chamber 201.

As an example of a first oxygen-containing gas (oxidizing source) containing oxygen as a reactive gas which is a second process gas containing a second element, $H_2O$ is supplied through the gas supply pipe 320 via the MFC 322, the valve 324, and the nozzle 420 into the process chamber 201. As an example of a catalytic source serving as a catalyst, pyridine ($C_5H_5N$) is supplied through the gas supply pipe 330. As an example of a second oxygen-containing gas containing oxygen which is a third process gas containing a third element, $O_2$ may be supplied through the gas supply pipe 340. Although the third process gas is not used in the present embodiment, for example, when a process of post-processing a formed silicon oxide film is performed after a silicon oxide film forming process to be described below, the third process gas may be used. Here, the post-processing process refers to, for example, a thermal process (annealing process), a plasma process, etc.

Also, for example, when a gas as described above is supplied from each of these gas supply pipes, a source gas supply system is configured using the first gas supply system. The source gas supply system is also referred to as a silicon-containing gas supply system (silicon-containing source supply system). Also, a first oxygen-containing gas supply system (first oxidizing source supply system) is configured using the second gas supply system. Furthermore, a catalyst supply system (catalytic source supply system) is configured using the third gas supply system. Also, a second oxygen-containing gas supply system (second oxidizing source supply system) may be configured using the fourth gas supply system. When the silicon-containing gas is referred to as a first process gas, a first process gas supply system is configured using the silicon-containing gas supply system. When the first oxygen-containing gas is referred to as a second process gas, a second process gas supply system is configured using the first oxygen-containing gas supply system. Also, when the third process gas is used, a third process gas supply system is configured using the second oxygen-containing gas supply system. Also, the source gas supply system, the first oxygen-containing gas supply system, and the second oxygen-containing gas supply system are referred to simply as a silicon-containing source supply system, a first oxidizing source supply system, and a second oxidizing source supply system, respectively. The first oxygen-containing gas may be referred to as a reactive gas serving as a gas which reacts with a source gas. In this case, the first oxygen-containing gas supply system is referred to as a first reactive gas supply system, and the second oxygen-containing gas supply system is referred to as a second reactive gas supply system.

Each of a first bar electrode 269, which is a first electrode having a thin and long structure, and a second bar electrode 270, which is a second electrode, extends from an upper portion of the reaction tube 203 to a lower portion thereof and is installed in the buffer chamber 237 and protected by an electrode protection tube 275 which is a protection tube for protecting electrodes. Any one of the first bar electrode 269 or the second bar electrode 270 is connected to a radio-frequency (RF) power source 273 via a matcher 272, and the other thereof is connected to an earth, which is a reference electric potential. As a result, plasma is generated in a plasma generation region 224 interposed between the first bar electrode 269 and the second bar electrode 270.

The electrode protection tube 275 is configured to be capable of being inserted into the buffer chamber 237 with each of the first and second bar electrodes 269 and 270 isolated from an atmosphere of the buffer chamber 237. Here, when the inside of the electrode protection tube 275 is the same atmosphere as the outside air [atmosphere], each of the first and second bar electrodes 269 and 270 inserted into the electrode protection tube 275 is oxidized by the heating of the heater 207. Thus, an inert gas purge mechanism is installed inside the electrode protection tube 275 and configured to fill with or purge an inert gas, such as nitrogen, and control an oxygen content to a sufficiently low content to prevent oxidation of the first bar electrode 269 or the second bar electrode 270. A plasma producing mechanism (plasma generating mechanism) is mainly configured by the first bar electrode 269, the second bar electrode 270, the electrode protection tube 275, the buffer chamber 237, and the gas supply hole 440b. The plasma producing mechanism functions as an activation mechanism configured to activate a gas and generate plasma, and the buffer chamber 237 functions as a plasma producing chamber (plasma generating chamber). Here, the matcher 272 and the RF power source 273 may be included in the plasma producing mechanism.

In addition, plasma generated in the present embodiment is referred to as remote plasma. The remote plasma refers to transferring plasma generated between electrodes to a surface of a material to be processed due to the flow of gases to perform plasma processing. In the present embodiment, since two bar electrodes 269 and 270 are accommodated in the buffer chamber 237, the substrate processing apparatus is configured to prevent ions affecting the wafer 200 from leaking into the process chamber 201 outside the buffer chamber 237. Also, an electric field is formed and plasma is generated to surround the two bar electrodes 269 and 270 [i.e., to surround the electrode protection tube 275 in which each of the two bar electrodes 269 and 270 is accommodated], and an electric field is formed and plasma is generated to surround the two bar electrodes 269 and 270 [i.e., to surround the electrode protection tube 275 in which each of the two bar electrodes 269 and 270 is accommodated]. An active species contained in the plasma is supplied via the gas supply holes 440b of the buffer chamber 237 from an outer circumference of the wafer 200 toward the center of the wafer 200. Also, as in the present embodiment, in a longitudinal batch-type apparatus in which a plurality of wafers 200 are stacked with main surfaces of the wafers 200 disposed parallel to horizontal surfaces thereof, since the buffer chamber 237 is disposed on an inner wall surface of the reaction tube 203, that is, in a position close to the wafer 200 to be processed, a generated active species is not deactivated but easily reaches the surface of the wafer 200.

An exhaust pipe 231 for exhausting an inside atmosphere of the process chamber is connected to the process chamber 201. As shown in FIG. 2, in a cross-sectional view, the exhaust pipe 231 is installed at a side of the reaction tube 203 opposite to a side in which the gas supply holes 410a of the nozzle 410, the gas supply holes 420a of the nozzle 420, the gas supply holes 430a of the nozzle 430, and the gas supply holes 440b of the buffer chamber 237 are installed. i.e., at a side opposite the gas supply holes 410a, 420a, 430a, and 440b with the wafer 200 interposed therebetween. Also, as shown in FIG. 1, in a longitudinal sectional view, the exhaust pipe 231 is installed below a point at which the gas supply holes 410a, 420a. 430a, and 440b are installed. Due to the above-described configuration, gases supplied through the gas supply holes 410a, 420a, 430a, and 440b into the vicinity of the wafer 200 in the process chamber 201 flow in a horizontal direction, i.e., a direction parallel to the surface of the wafer 200, flow downward, and are exhausted through the exhaust pipe 231. A main flow of the gases in the process chamber 201 is in the horizontal direction as described above.

A pressure sensor 245 serving as a pressure detector (pressure detection unit) configured to detect pressure in the process chamber 201 is connected to the exhaust pipe 231. A vacuum pump 246 serving as a vacuum exhaust device is connected to exhaust pipe 231 via an auto pressure controller (APC) valve 243e serving as a pressure adjustor (pressure adjustment unit). The pressure sensor 245 and the vacuum pump 246 are configured to vacuum-exhaust an inside pressure of the process chamber 201 to a predetermined pressure (degree of vacuum). The exhaust pipe 231 is connected to a waste gas processing device (not shown) at a downstream side of the vacuum pump 246. Also, the APC valve 243e is an opening/closing valve configured to vacuum-exhaust the inside atmosphere of the process chamber 201 or stop the vacuum-exhausting by opening/closing the APC valve 243e, and to adjust conductance by controlling a degree of opening of the APC valve 243e and adjust pressure in the process chamber 201. Here, vacuum is not limited to a state in which an inside pressure of the process chamber 201 becomes a pressure of 0 Pa but includes a state in which when an inside atmosphere of the process chamber 201 is exhausted by opening the APC valve 243e, a value of the inside pressure of the process chamber 201 is not reduced any more [a state in which the inside atmosphere of the process chamber 201 is vacuum-exhausted]. An exhaust system, i.e., an exhaust line, is mainly configured by the exhaust pipe 231, the APC valve 243e, and the pressure sensor 245. Also, the exhaust system may further include the vacuum pump 246. Furthermore, the exhaust system may further include a trap apparatus or a detoxifying apparatus.

In the reaction tube 203, a temperature sensor 263 is installed as a temperature detector, and is configured to control an amount of current to be supplied to the heater 207 based on temperature information detected by the temperature sensor 263, so that the temperature in the process chamber 201 may have a desired temperature distribution. The temperature sensor 263 has an L shape, and is introduced through the manifold 209 and installed along an inner wall of the reaction tube 203.

Figure 3:
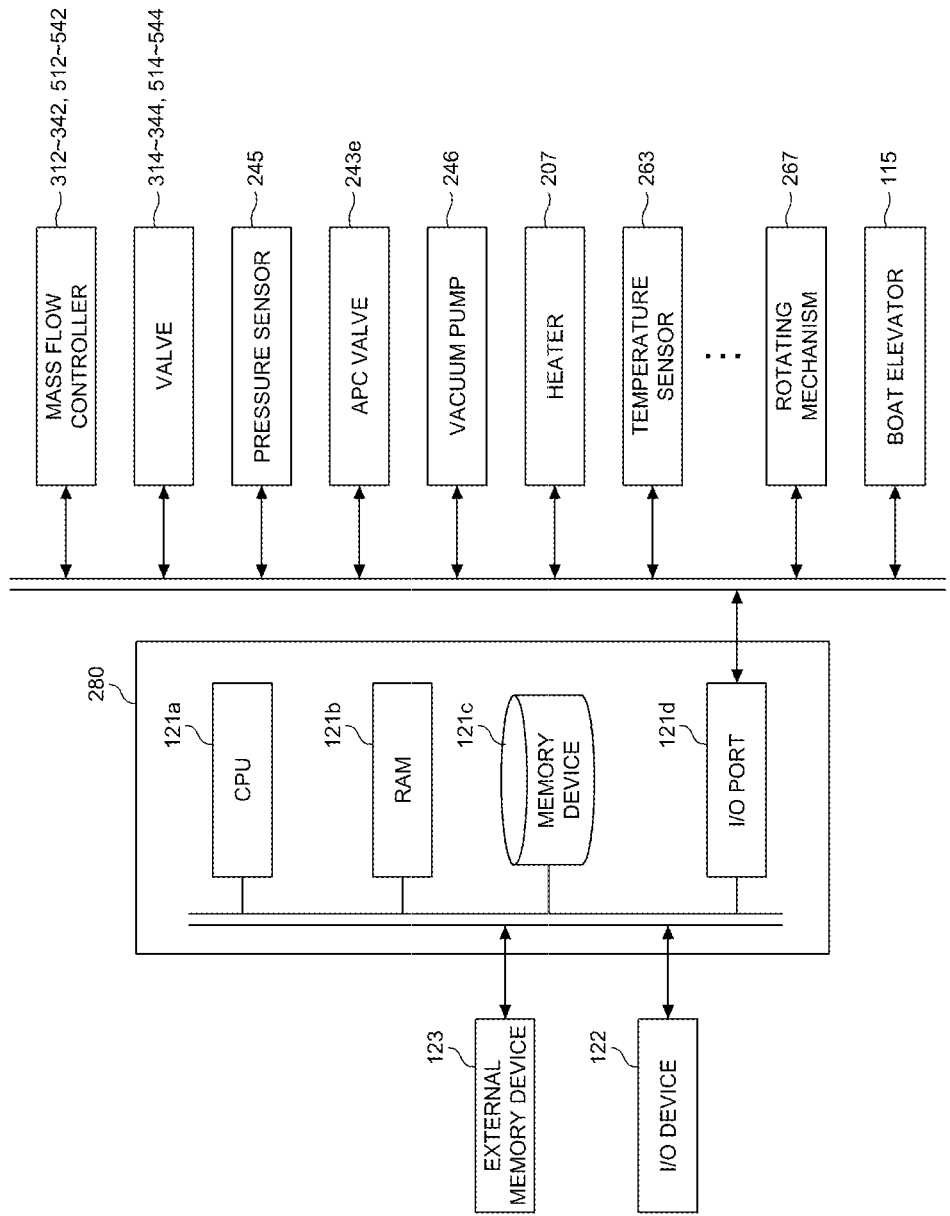
FIG. 3 is a block diagram of a schematic configuration of a controller included in a substrate processing apparatus 10 shown in FIG. 1, which is preferably used in an exemplary embodiment of the present invention.

A controller 280 is illustrated in FIG. 3. As shown in FIG. 3, the controller 280 is configured as a computer including a central processing unit (CPU) 121a, a random access memory (RAM) 121b, a memory device 121c, and an I/O port 121d. The RAM 121b, the memory device 121c, and the I/O port 121d are configured to be capable of exchanging data with the CPU 121a via an internal bus (not shown). An I/O device 122 configured as, for example, a touch panel, is connected to the controller 280.

The memory device 121c is configured, for example, as a flash memory, a hard disk drive (HDD), or the like. In the memory device 121c, a control program for controlling an operation of a substrate processing apparatus or a process recipe including an order or conditions of substrate processing which will be described below is stored to be readable. The process recipe is a combination of sequences of a substrate processing process which will be described below to obtain a desired result when the sequences are performed by the controller 280, and acts as a program. Hereinafter, the process recipe, the control program, etc. will also be referred to together simply as a 'program.' Also, when the term 'program' is used in the present disclosure, it should be understood as including only a process recipe, only a control program, or both of the process recipe and the control program. Also, the RAM 121b is configured as a memory area (work area) in which a program or data read by the CPU 121a is temporarily stored.

The I/O port 121d is connected to the MFCs 312, 322, 332, 342, 512, 522, 532, and 542, the valves 314, 324, 334, 344, 514, 524, 534, and 544, the pressure sensor 245, the APC valve 243e, the vacuum pump 246, the heater 207, the temperature sensor 263, the boat rotating mechanism 267, the boat elevator 115, etc. which are described above.

The CPU 121a is configured to read and execute the control program from the memory device 121c and to read the process recipe from the memory device 121c according to a manipulation command received via the I/O device 122. Also, according to the read process recipe, the CPU 121a is configured to control flow rates of various gases via the MFCs 312, 322, 332, 342, 512, 522, 532, and 542; control opening/closing of the valves 314, 324, 334, 344, 514, 524, 534, and 544; control the degree of pressure by opening/closing the APC valve 243e based on the pressure sensor 245 using the APC valve 243e; control temperature using the heater 207 based on the temperature sensor 263; control driving/stopping of the vacuum pump 246; control the rotation and rotation speed of the boat 217 using the boat rotating mechanism 267; control upward/downward movement of the boat 217 using the boat elevator 115, etc.

The controller 280 is not limited to a dedicated computer and may be configured as a general-purpose computer. For example, the controller 280 according to the present embodiment may be configured by preparing an external memory device 123 storing a program as described above [e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.)], and then installing the program in a general-purpose computer using the external memory device 123. Also, a unit for supplying a program to a computer is not limited to using the external memory device 123. For example, a program may be supplied to a computer using a communication unit, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be referred together to as simply a 'recording medium.' Also, when the term 'recording medium' is used in the present disclosure, it may be understood as only the memory device 121c, only the external memory device 123, or both the memory device 121c and the external memory device 123.

Next, as an example of a method of manufacturing a semiconductor device, a method of manufacturing a large-scale integration (LSI) circuit to which the present invention is applied will be described. Here, an example in which a silicon oxide film (which is also referred to as a $SiO_2$ film or SiO film) is formed on a substrate at a low temperature using a substrate processing apparatus will be described. For example, a resist pattern formed of a resin-based photoresist material may be formed on the substrate. In the following description, operations of each of the constitutional elements of the substrate processing apparatus are controlled by the controller 280.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied onto a wafer' should be understood to mean that the specific gas is directly supplied onto a surface (exposed surface) of the wafer itself or that the specific gas is supplied onto a surface of a layer/film formed on the wafer. i.e., on the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on the layer/film formed on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

<Silicon Oxide Film Forming Process>

In a silicon oxide film forming process, a silicon oxide film is formed on the wafer 200 or on a resist pattern or hard mask (not shown) formed on the wafer 200. In this case, a layer is formed on a substrate by alternately supplying at least two types of source gases serving as sources, which contribute to formation of a film, under specific film forming conditions (temperature, pressure, time, etc.), to perform a film forming process.

Figure 4:
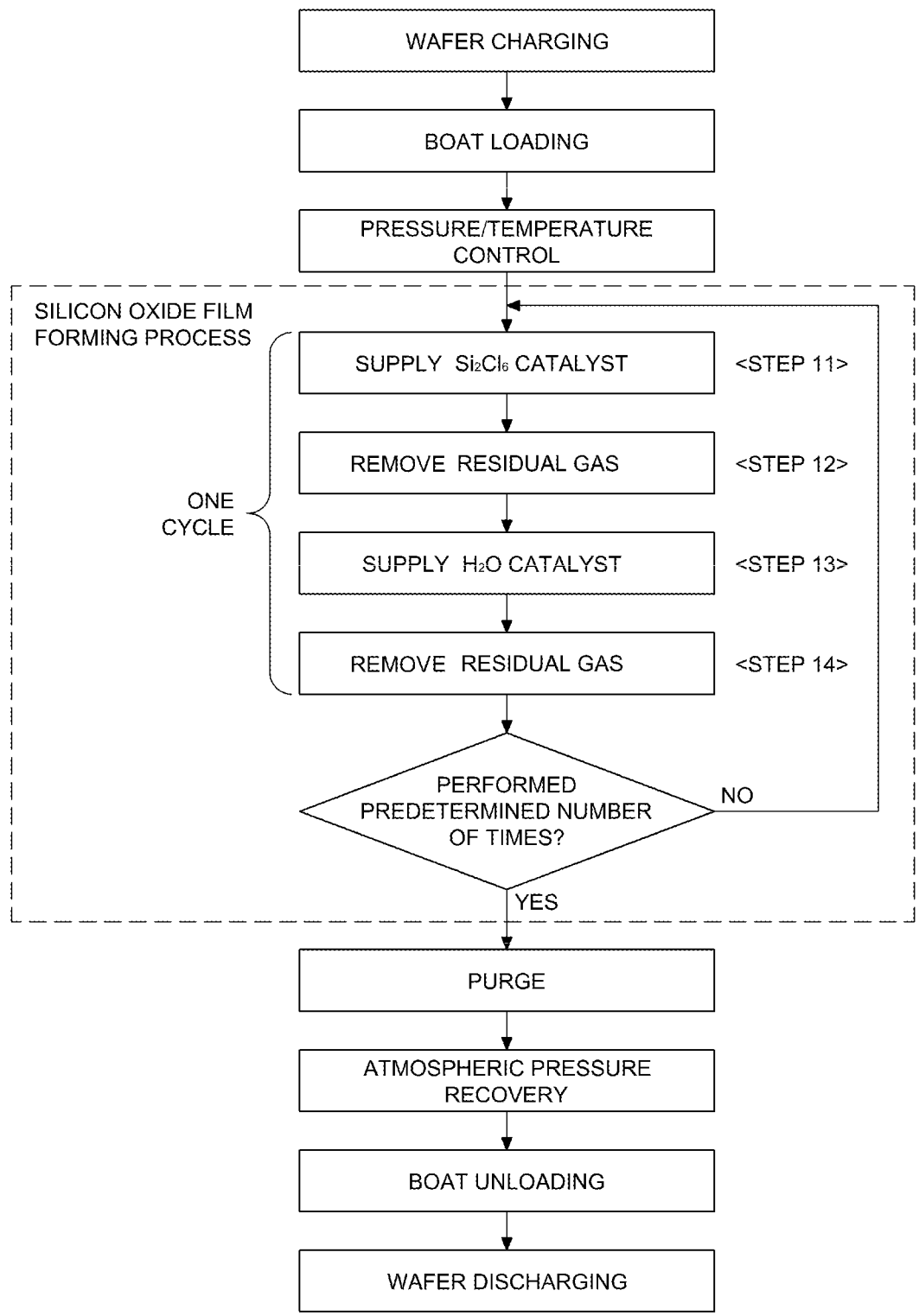
FIG. 4 is a flowchart illustrating a process of forming a silicon oxide film according to a first embodiment of the present invention.

Here, a case in which silicon is used as a first element, oxygen is used as a second element, $Si_2Cl_6$ gas generated by vaporizing a liquid source (e.g., $Si_2Cl_6$) which is a silicon-containing source using a vaporization system, such as a vaporizer or a bubbler, is used as a first source gas containing a first element, an oxygen-containing gas (e.g., $H_2O$ gas) is used as a second source gas containing a second element, pyridine is used as an example of a catalyst, and $N_2$ gas is used as an example of a carrier gas will be described with reference to FIG. 4.

That is, the heater 207 is controlled to retain the inside atmosphere of the process chamber 201 at a temperature lower than a denaturation temperature of a resist layer, for example, a temperature between room temperature and a temperature of about 200° C. preferably, room temperature to a temperature of about 150° C., and more preferably, room temperature to about 100° C., for example, a predetermined temperature between a temperature of 65° C. to about 90° C. Here, the inside atmosphere of the process chamber 201 is retained at a temperature of about 65° C. Afterwards, a plurality of wafers 200 are placed in the boat 217, and the boat 217 is loaded into the process chamber 201. Next, the wafers 200 are rotated by rotating the boat 217 using the boat rotating mechanism 267. Thereafter, the valve 243e is opened to vacuum-exhaust the inside atmosphere of the process chamber 201 with the vacuum pump 246 operated. When a temperature of the wafer 200 reaches a temperature of about 65° C. and is stabilized, four steps to be described below are sequentially performed with the inside atmosphere of the process chamber 201 retained at a temperature of about 65° C.

(Step 11)

While $Si_2Cl_6$ gas is being introduced (supplied) into the gas supply pipe 310, $H_2O$ is being introduced (supplied) into the gas supply pipe 320, pyridine is being introduced (supplied) into the gas supply pipe 330, and $N_2$ gas is being introduced (supplied) into the carrier gas supply pipes 510, 520, 530, and 540, the valves 314, 334, 514, 524, 534, and 544 are appropriately opened. However, the valves 324 and 344 are closed. The process of step 11 will be referred to as a first source gas supply process.

As a result, $Si_2Cl_6$ gas is mixed with $N_2$ gas, flows through the gas supply pipe 310, flows out from the nozzle 410, and is supplied through the gas supply hole 410a into the process chamber 201. Also, pyridine is also mixed with $N_2$ gas, flows through the gas supply pipe 330, flows out from the nozzle 430, and is supplied through the gas supply hole 430a into the process chamber 201. Furthermore, $N_2$ gas flows through the carrier gas supply pipes 520 and 540, flows out from the nozzles 420 and 440, and is supplied through the gas supply holes 420a and 440b into the process chamber 201. $Si_2Cl_6$ gas and pyridine supplied into the process chamber 201 are exposed to the surface of the wafer 200. In this case, an inside pressure of the process chamber 201 is controlled to be a predetermined pressure.

In step 11, by controlling the valves 314 and 334, a duration for which $SiCl_6$ gas and pyridine are supplied is set to be within a range of 1 to 100 seconds, preferably, 5 to 30 seconds. Also, when a ratio of a supply amount (flow rate) of $Si_2Cl_6$ gas to a supply amount (flow rate) of pyridine is expressed by a ratio of $Si_2Cl_6$ gas (sccm) to pyridine (sccm), the valves 314 and 334 are controlled such that the ratio is between 0.01 and 100, preferably, between 0.05 and 10. Simultaneously, by appropriately adjusting the APC valve 243e, an inside pressure of the process chamber 201 is set to be an optimum value (e.g., 10 Torr) within a specific range. In step 11, $Si_2Cl_6$ gas and pyridine are supplied into the process chamber 201 to form a silicon-containing layer on the wafer 200 or a resist pattern or hard mask (not shown) formed on the wafer 200. In step 11, by supplying $Si_2Cl_6$ gas and pyridine into the process chamber 201, pyridine acts on O—H bonds formed on the wafer 200 to draw hydrogen. That is, the chlorine of $Si_2Cl_6$ molecules reacts with hydrogen by weakening O—H bonding strength, so that HCl is deintercalated and an intermediate (halide) of the $Si_2Cl_6$ molecules remains on the wafer 200.

(Step 12)

By stopping the supply of $Si_2Cl_6$ gas and pyridine by closing off the valves 314 and 334 and opening (e.g., full opening) the APC valve 243e, an exhaust process of exhausting an inside atmosphere of the process chamber 201 out of the process chamber 201 is performed. In this case, since the supply of $N_2$ gas is stopped by closing off the valves 514, 524, 534 and 544, $N_2$ gas serving as a purge gas is not supplied into the process chamber 201. After a predetermined time has elapsed, a purge process of supplying $N_2$ gas into the process chamber 201 is performed by closing (e.g., full closing) the APC valve 243e. In this case, the valves 514, 524, 534, and 544 are opened to supply $N_2$ gas through the carrier gas supply pipes 510, 520, 530, and 540 into the process chamber 201. The exhaust process and the purge process are defined as one cycle, and the cycle is repeated a plurality of times. As a result, $Si_2Cl_6$ gas, pyridine, or reaction byproducts in the process chamber 201, particularly, in the vicinity of a center of the wafer 200, are removed from the process chamber 201. The process of step 12 will be referred to as a first distribution process. In the present embodiment, after the cycle is repeated a plurality of times in the first distribution process, an exhaust process is set as a final process.

The gas remaining in the process chamber 201 may not be completely eliminated and the inside atmosphere of the process chamber 201 may not be completely purged. When a small amount of a gas remains in the process chamber 201, step 13 to be performed thereafter will not be negatively influenced by the gas. In this case, the flow rate of the $N_2$ gas to be supplied into the process chamber 201 need not to be high. For example, the inside atmosphere of the process chamber 201 may be purged without causing step 13 to be negatively influenced by the gas by supplying an amount of gas corresponding to the capacity of the reaction tube 203 [process chamber 201]. As described above, when the inside atmosphere of the process chamber 201 is not completely purged, a purge time may be reduced to improve the throughput. Furthermore, the consumption of the $N_2$ gas may be suppressed to a necessary minimum level.

(Step 13)

While the valves 514, 524, 534 and 544 are open, the valves 324 and 334 are appropriately opened. The valves 314 and 344 are in a closed state. As a result, $H_2O$ gas is mixed with $N_2$ gas, flows through the gas supply pipe 320, flows out from the nozzle 420, and is supplied through the gas supply hole 420a into the process chamber 201. Also, pyridine is also mixed with $N_2$ gas, flows through the gas supply pipe 330, flows out from the nozzle 430, and is supplied through the gas supply hole 430a into the process chamber 201. Furthermore, $N_2$ gas flows through the carrier gas supply pipes 510 and 540, flows out from the nozzles 410 and 440, and is supplied through the gas supply holes 410a and 440b into the process chamber 201. $H_2O$ gas serving as the second source gas and pyridine, which are supplied into the process chamber 201, pass over the surface of the wafer 200 and are exhausted through the exhaust pipe 231. The process of step 13 will be referred to as a second source gas supply process.

In step 13, by controlling the valves 324 and 334, a duration for which $H_2O$ gas and pyridine are supplied is set to be within a range of 1 to 100 seconds, preferably, 5 to 30 seconds. Also, when a ratio of a supply amount (flow rate) of $H_2O$ gas to a supply amount (flow rate) of pyridine is expressed by a ratio of $H_2O$ gas (sccm) to pyridine (sccm), the valves 324 and 334 are controlled such that the ratio is between 0.01 and 100, preferably, between 0.05 and 10. Simultaneously, by appropriately adjusting the valve 243e, an inside pressure of the process chamber 201 is set to be an optimum value (e.g., 10 Torr) within a specific range. In step 13, by supplying $H_2O$ gas and pyridine into the process chamber 201, pyridine acts on O—H bonds contained in $H_2O$. By weakening O—H bonding strength, OH or O reacts with a silicon-containing layer formed on the wafer 200. Chlorine contained in the silicon-containing layer reacts with OH or O to deintercalate HCl, and O or OH reacts with silicon contained in the silicon-containing layer so that a SiO-containing layer containing silicon and oxygen is formed on the wafer 200 or a resist pattern or hard mask (not shown) formed on the wafer 200. Also, $H_2O$ gas is preferably supplied at the same content as pyridine.

In addition, an oxidizing source (source corresponding to $H_2O$ gas) supplied in step 13 needs to contain atoms having a high electronegativity in molecules, and have electrical polarization. This is due to the fact that since pyridine has a high electronegativity, a reaction is facilitated by reducing an activation energy of a source gas. Accordingly, $H_2O$ or $H_2O_2$ containing O—H bonds is appropriately used as the source gas supplied in step 13, and nonpolar molecules, such as $O_2$ or $O_3$, are inappropriate.

(Step 14)

Subsequently, the valves 324 and 334 are closed to stop the supply of $H_2O$ gas and pyridine into the process chamber 201 and also, the valves 514, 524, 534, and 544 are closed to stop the supply of N₂ gas into the process chamber 201. In this case, the APC valve 243e is opened (e.g., fully opened). After a time duration T5 has elapsed before the inside atmosphere of the process chamber 201 reaches a vacuum state, the APC valve 243e is closed (e.g., fully closed). In this case, the valves 514, 524, 534, and 544 are opened to supply N₂ gas serving as a purge gas through the carrier gas supply pipes 510, 520, 530, and 540 into the process chamber 201. As described above, the stopping of the supply of a purge gas and the opening of the APC valve 243e, and the supply of a purge gas and the closing of the APC valve 243e are included in one cycle, and the cycle is performed a desired number of times. As a result. H₂O gas, pyridine, or reaction byproducts in the process chamber 201, particularly, in the vicinity of the center of the wafer 200, are removed from the process chamber 201. The process of step 14 will be referred to as a second distribution process. Also, in the present embodiment, after the cycle is repeated a plurality of cycles, an exhaust process is set as a final process.

In this case, the gas remaining in the process chamber 201 may not be completely eliminated and the inside atmosphere of the process chamber 201 may not be completely purged. When a small amount of gas remains in the process chamber 201, step 11 to be performed thereafter will not be negatively influenced by the gas. In this case, the flow rate of the N₂ gas to be supplied into the process chamber 201 need not be high. For example, the inside atmosphere of the process chamber 201 may be purged without causing step 11 to be negatively influenced by the gas by supplying an amount of a gas corresponding to the capacity of the reaction tube 203 [process chamber 201]. As described above, when the inside atmosphere of the process chamber 201 is not completely purged, a purge time may be reduced to improve the throughput. Furthermore, the consumption of the N₂ gas may be suppressed to a necessary minimum level.

Subsequently, steps 11 through 14 are defined as one cycle of the silicon oxide film forming process, and a SiO film is formed to a predetermined film thickness on the wafer 200 or a resist pattern or hard mask (not shown) formed on the wafer 200 by repeating the cycle a plurality of times.

Figure 5:
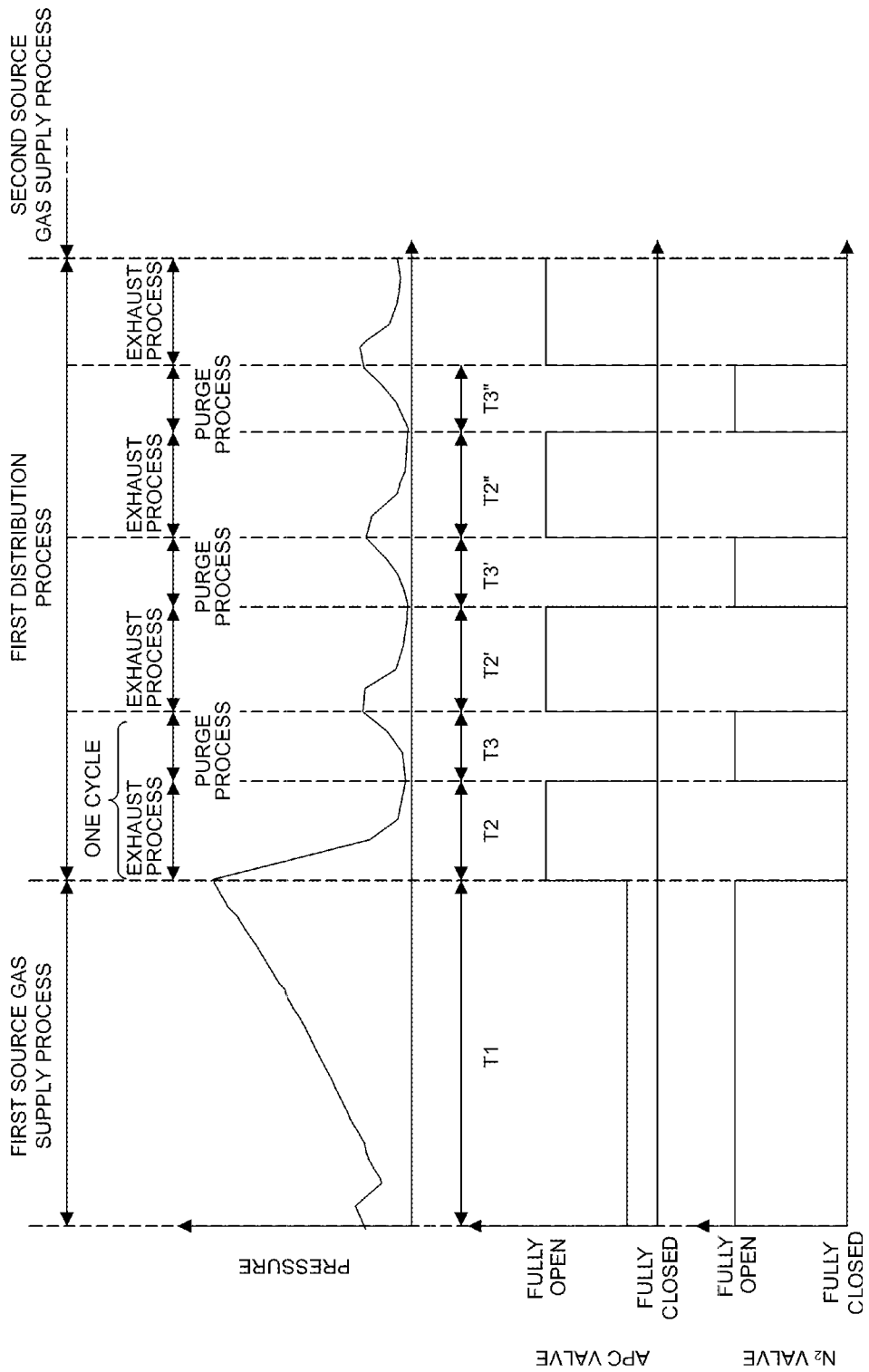
FIG. 5 illustrates opening/closing states of an auto pressure controller (APC) valve in a first source gas supply process and a first distribution process according to the first embodiment of the present invention.
Figure 6:
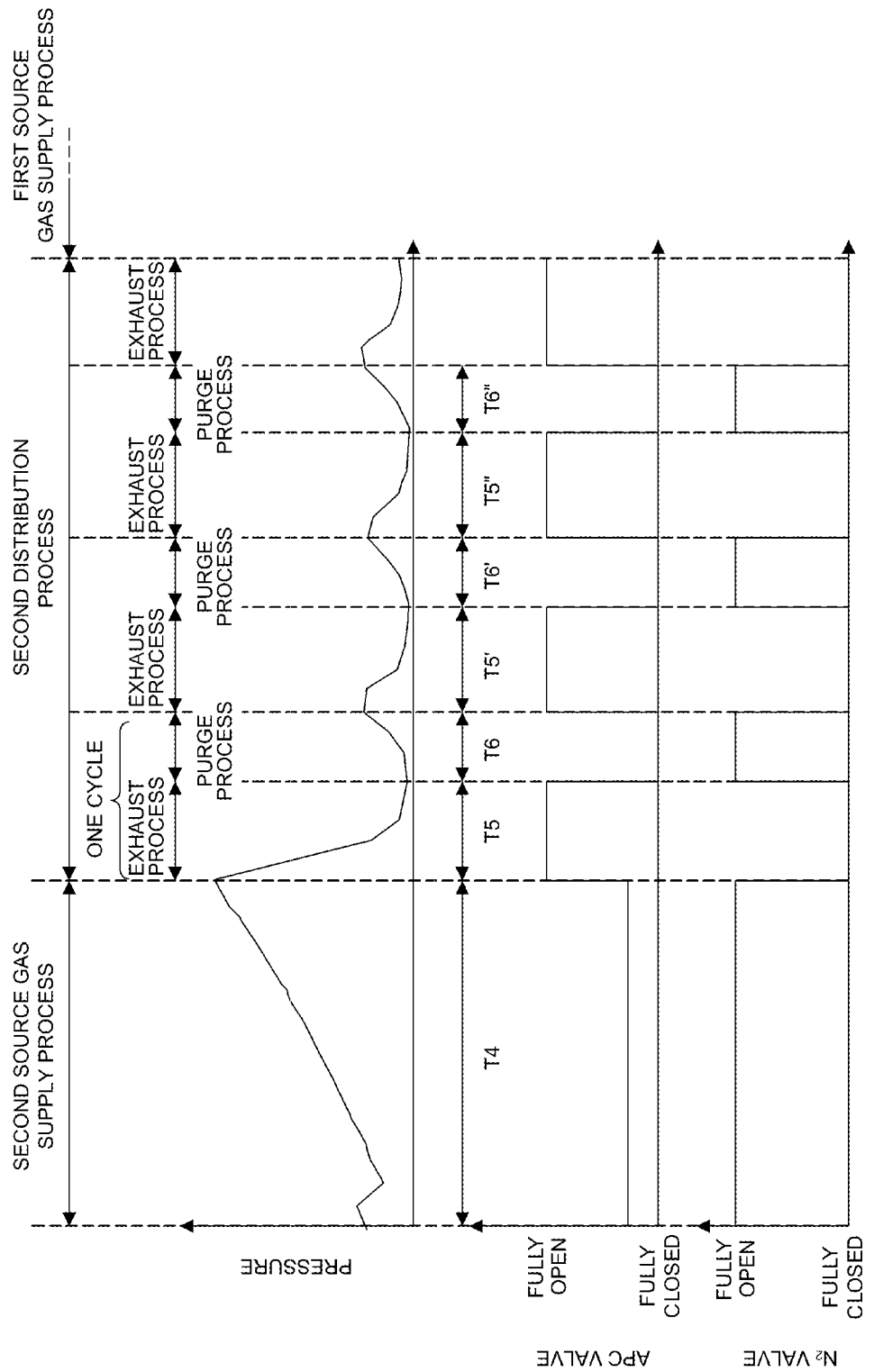
FIG. 6 illustrates opening/closing states of an APC valve in a second source gas supply process and a second distribution process according to the first embodiment of the present invention.

Furthermore, the processes of steps 11 through 14 will be described in detail with reference to FIGS. 5 and 6. In the first source gas supply process of supplying Si₂Cl₆ gas serving as the first source gas into the process chamber 201, the APC valve 243e is controlled to set the inside pressure of the process chamber 201 to be a predetermined pressure. As shown in FIG. 5, when the first source gas supply process is ended (time duration T1), the first distribution process is started. The first distribution process includes performing a cycle including the exhaust process and the purge gas as described above once or more (a plurality of times) and performing an exhaust process after performing the cycle the plurality of times. With the start of the current process, the supply of the purge gas is stopped, and the APC valve 243e is opened (e.g., fully opened) so that an inside atmosphere of the process chamber 201 is exhausted out of the process chamber 201, and an inside pressure of the process chamber 201 is reduced. Before a time duration T2 for which the inside pressure of the process chamber 201 is reduced and reaches a vacuum state [the inside of the process chamber 201 is vacuum-exhausted], the supply of a purge gas is started, and the APC valve 243e is closed (e.g., fully closed) to perform a purge process. N₂ gas is supplied as a purge gas into the process chamber 201 to increase an inside pressure of the process chamber 201.

When the purge process is performed for a predetermined time duration T3, the supply of a purge gas is stopped again, and the APC valve 243e is opened (e.g., fully opened) again to reduce an inside pressure of the process chamber 201 again. Before a time duration T2' for which the inside pressure of the process chamber 201 is continuously reduced and reaches a vacuum state [the inside of the process chamber 201 is vacuum-exhausted], the supply of a purge gas is started, and the APC valve 243e is closed (e.g., fully closed) to increase the inside pressure of the process chamber 201. After a predetermined time duration T3' has elapsed, the supply of the purge gas is stopped, and the APC valve 243e is opened (for example, fully opened). During the purge process, the stopping of the supply of a purge gas into the process chamber 201 and the opening of the APC valve 243e, and the supply of a purge gas into the process chamber 201 and the closing of the APC valve 243e are repeated a plurality of times. Thus, the inside pressure of the process chamber 201 is alternately increased and decreased at intervals of a predetermined time duration. In this case, as shown in FIG. 5, it can be seen that the inside pressure of the process chamber 201 varies along a wave form during a distribution process.

Subsequently, a second source gas supply process of supplying H₂O gas as the second source gas into the process chamber 201 is started. In the second source gas supply process, the APC valve 243e is controlled to set an inside pressure of the process chamber 201 to be a predetermined pressure. As shown in FIG. 6, when the second source gas supply process is ended (time duration T4), a second distribution process is started. Similar to the first distribution process as described above, the second distribution process includes performing a cycle including an exhaust process (T5, T5', . . . ) and a purge process (T6, T6', . . . ) a plurality of times and performing an exhaust process after the cycle is performed a plurality of times.

The above-described first embodiment has described a case in which a cyclic purge process of repeating one cycle including opening the APC valve 243e [in this case, the supply of a purge gas into the process chamber 201 is not performed] and closing the APC valve 243e [in this case, the supply of a purge gas into the process chamber 201 is performed] a predetermined number of times is performed in both the first distribution process and the second distribution process. However, the cyclic purge process may be applied to only one of the first distribution process or the second distribution process. Also, a final exhaust process is not performed, and the next source gas supply process may be performed after the cycle is performed a plurality of cycles, that is, after the purge process. Also, after the source gas supply process, preferentially performing a purge process without preferentially performing an exhaust process and performing an exhaust process after the purge process may be included in one cycle.

In addition, a case in which the supply of N₂ gas is synchronized with the opening/closing of the APC valve 243e (e.g., synchronization of the stopping of the supply of N₂ gas with the opening of the APC valve 243e and synchronization of the supply of N₂ gas with the closing of the APC valve 243e) has been described, but the present embodiment is not limited thereto. That is, in the present embodiment, as shown in FIG. 5, an inside pressure of the process chamber 201 may vary along a wave form during a distribution process. For example, a flow rate of N₂ gas may be increased and decreased by controlling an opening degree of the APC valve 243e to be constant. Also, for example, the opening degree of the APC valve 243e may be increased and decreased by controlling the flow rate of $N_2$ gas to be constant. Furthermore, increasing and decreasing the flow rate of $N_2$ gas may be combined with increasing and decreasing the opening degree of the APC valve 243e.

According to the first embodiment of the present invention, at least one of the following effects is obtained.

1. An inside atmosphere of the process chamber 201 is exhausted out of the process chamber by opening (e.g., full opening) the valve 243e, and $N_2$ gas serving as a purge gas is sealed in the process chamber 201 by closing (e.g., full closing) the valve 243e, so that $N_2$ gas may sufficiently diffuse into the process chamber 201 and $N_2$ gas and residues, such as completely unreacted process gases or byproducts, in the process chamber 201 may be sufficiently discharged out of the process chamber 201. In particular, since $N_2$ gas is supplied to the vicinity of the center of the wafer 200, residues remaining in a central portion of the wafer 200 may be forcibly discharged by $N_2$ so that the residues may be removed more efficiently.

2. By controlling each of a time point at which $N_2$ gas is supplied and the supply of $N_2$ gas is stopped and a time point at which the APC valve is opened and closed, an inside pressure of the process chamber 201 may vary along a wave form. By controlling the time points, $N_2$ gas flowing from the gas supply nozzle between the stacked wafers 200 through the vicinity of the center of the wafer 200 toward the exhaust pipe 231 may form a strong flow (main flow), and residues remaining in the above-described portion may be efficiently removed, thereby improving purge efficiency with which the residues in the process chamber 201 are discharged out of the process chamber 201.

3. By repeating the supply of $N_2$ gas and the stopping of the supply of $N_2$ gas, residues in the process chamber 201 may be extruded out of the process chamber 201 by $N_2$ gas, and discharged from the inside of the process chamber 201 out of the process chamber 201 along with the supplied $N_2$ gas. That is, replacement efficiency with which the residues in the process chamber 201 are replaced with $N_2$ gas is improved. Also, in this case, by controlling a time point at which the APC valve is opened and closed in accordance with the supply of $N_2$ gas and the stopping of the supply of $N_2$ gas, the flow of $N_2$ gas into the process chamber 201 may be further strengthened, thereby improving the replacement efficiency caused by the above-described extrusion and discharge of the residues.

Next, a second embodiment of the present invention will be described with reference to FIG. 7. The present embodiment differs from the first embodiment in that when an APC valve 243e is closed in only a first distribution process, only a second distribution process or both the first and second distribution processes, a maximum value of the increased inside pressure of the process chamber 201 is controlled to gradually decrease. A description of the same portions as in the first embodiment will be omitted.

As shown in FIG. 7, for example, time durations for which the APC valve 243e is opened are denoted by T2, T2', T2", . . . , and time durations for which the APC valve 243e is closed are denoted by T3, T3', T3', . . . . When the time durations for which the APC valve 243e is opened are set to be equal (T2=T2'= . . . ), by controlling the time durations for which the APC valve 243e is closed to satisfy an inequality: T3>T3'>T3" . . . , a maximum value of an inside pressure of the process chamber 201 may be controlled to gradually decrease as a cycle is continuously performed. Also, the APC valve 243e may be controlled to satisfy an inequality: T2>T3 (T2'>T3', T2">T3" . . . ). The present invention is not limited to the case as described above. Time points at which the APC valve 243e is opened and closed or a flow rate of $N_2$ gas may be arbitrarily set such that a maximum value of the increased inside pressure of the process chamber 201 gradually decreases.

In addition, a minimum value of the inside pressure of the process chamber 201 instead of the maximum value thereof may be controlled to gradually decrease as the cycle is continuously performed. For example, when the time durations for which the APC valve 243e is closed are set to be equal (T3=T3'= . . . ), the time durations for which the APC valve 243e is opened may be controlled to satisfy an inequality: T2<T2'<T2" . . . .

By gradually decreasing the maximum value or minimum value of the inside pressure of the process chamber 201 as the cycle is continuously performed, a flow velocity of $N_2$ gas in the process chamber 201 may be varied. When $N_2$ gas easily diffuses into the process chamber 201 under a high temperature, during a first cycle, $N_2$ gas passing between the wafers 200 through the vicinity of the center of the wafer 200 forms a strong flow and, particularly, residues in the vicinity of the center of the wafer 200 is preferentially removed. Thus, during subsequent cycles, residues in the remaining process chamber 201 may be removed by gradually decreasing the maximum value of the inside pressure of the process chamber 201, and it becomes possible to efficiently remove the residues. Since a flow velocity of a gas may be varied according to a variation in pressure, the status of diffusion of the gas into the process chamber 201 may be changed. As a result, the entire inside of the process chamber 201 may be uniformly purged.

Furthermore, a third embodiment of the present invention will be described with reference to FIG. 7. The present embodiment differs from the first embodiment in that a purge time is controlled to be longer in a second distribution process performed after supplying a second source gas than in a first distribution process performed after supplying a first source gas.

For example, a silicon-containing source is used as the first source, and $H_2O$ gas is used as the second source. In this case, $H_2O$ gas used as the second source is liable to remain in the process chamber 201. In particular, since it is difficult to remove $H_2O$ gas between the wafers 200, $H_2O$ gas which is the second source may be effectively removed by increasing time taken to perform the second distribution process after supplying the second source.

A fourth embodiment of the present invention will be described with reference to FIG. 7. The present embodiment differs from the first embodiment in that the number of purge cycles is controlled to be larger in the second distribution process performed after supplying the second source gas than in the first distribution process performed after supplying the first source gas. Here, a purge cycle refers to one cycle including opening an APC valve 243e and closing the APC valve 243e during a purge process.

For example, when the second source gas is a source gas which is more liable to remain in the process chamber 201 than the first source gas, the second source gas may be effectively removed by controlling the number of purge cycles of the first distribution process to be larger than the number of purge cycles of the second distribution process. Since the number of times that residues remaining on an inner wall of the process chamber 201 or a substrate are extruded and discharged due to $N_2$ gas may be increased by increasing the number of purge cycles, the residues may be effectively removed.

A fifth embodiment of the present invention will be described with reference to FIG. 7. The present embodiment differs from the first embodiment in that a time duration corresponding to one cycle of a distribution process is controlled to gradually decrease as the cycle is continuously performed.

For example, a time duration (T2+T3) for which an APC valve 243e is opened, closed, and then opened again is controlled to gradually decrease in the distribution process. Alternatively, in the distribution process, a time duration for which the APC valve 243e is closed and then opened again is controlled to gradually decrease. In other words, in FIG. 7, time durations are controlled to satisfy an inequality: T2>T2'>T2" . . . or T3>T3'>T3" . . . . By controlling the time durations, time taken to perform the distribution process may be reduced, and time required to form a film may be reduced, thereby improving productivity of an apparatus.

The first through fifth embodiments described above may be performed alone or any combination thereof may be performed. Also, the present invention is not limited to the embodiments described above and may be embodied in various different forms without departing from the scope of the present invention.

Although an example in which $Si_2Cl_6$ is used as a silicon source has been described in the present embodiment, other sources may be used. For example, a silicon-containing organic compound may be used. For example, tris(dimethyl amino)silane (TDMAS, $SiH[N(CH_3)_2]_3$), dichlorosilane ($SiH_2Cl_2$), trichlorosilane ($SiHCl_3$), tetrachlorosilane ($SiCl_4$), bis(tertiary butyl amino)silane (BTBAS), bis(diethyl amino)silane (BDEAS), bis(diethyl methylamino)silane (BDEMAS), tris(dimethyl amino)silane (TDMAS), or hexamethyl disilazane (HMDS) may be used. When the silicon-containing organic compound is used, a film quality or a wet etch rate (WER) may be improved by supplying carbon into a silicon oxide film.

Although an example in which $H_2O$ is used as an oxidizing source has been described, other oxidizing sources may be used. In this case, an oxidizing source needs to contain atoms having a different electronegativity in molecules, and have electrical polarization. This is due to the fact that a catalyst acts on molecules having electrical polarization, and a reaction is facilitated by reducing an activation energy of a source gas. Accordingly, $H_2O$, $H_2O_2$, $H_2+O_2$ mixture plasma, or $H_2+O_3$ containing O—H bonds may be used as the oxidizing source. Meanwhile, nonpolar molecules, such as $O_2$ or $O_3$, are inappropriate.

In addition, although an example in which pyridine is used as a catalyst has been described, other catalysts may be used. Another material may be used as the catalyst as long as the material has an acid dissociation constant (pKa) of about 5 to 7. For example, pyridine, aminopyridine, picoline, piperazine, or lutidine may be used.

After the film forming process, a process of post-processing the formed thin film may be performed. For example, a plasma process or thermal process using $O_2$ or $NH_3$ may be performed. For example, moisture may be removed from a SiO film using $NH_3$. In this case, although a nitrogen-containing SiON film is formed not in an entire SiO film but in a portion thereof, a WER is improved by converting Si—H bonds into Si—O—N bonds. Also, an activation unit other than plasma may be used. For example, a post-processing process using beams or microwaves may be performed.

Furthermore, the present invention may be applied to a high-k film (a metal oxide film, such as a TiO, ZrO, or TiSiO) using a metal source instead of a silicon source.

In addition, although an example in which a substrate processing apparatus which is a batch-type longitudinal apparatus configured to process a plurality of substrates at one time is used has been described, other apparatuses may be used. For example, a single-wafer-type substrate processing apparatus configured to process one substrate or several substrates at once may be used. Also, the present invention is not limited to using a hot-wall-type process furnace, but is applicable to a cold-wall-type process furnace.

In a substrate processing apparatus, a method of manufacturing a semiconductor device and a method of processing a substrate according to one exemplary embodiment of the present invention, in-plane uniformity of the substrate can be improved.

Exemplary embodiments of the present invention will be supplementarily described below.

(Supplementary Note 1)

According to one aspect of the present invention, there is provided a method of manufacturing a semiconductor device, including:

(a) transferring a substrate into a process chamber:

(b) forming a film on the substrate in the process chamber; and (c) unloading the substrate from the process chamber, wherein the step (b) includes (b-1) supplying a source gas into the process chamber and (b-2) supplying an inert gas into the process chamber and exhausting the source gas and the inert gas from the process chamber, and supplying the inert gas into the process chamber and stopping the supply of the inert gas into the process chamber are repeated in step (b-2).

(Supplementary Note 2)

The method of Supplementary note 1, wherein an inside pressure of the process chamber varies in the step (b-2).

(Supplementary Note 3)

The method of Supplementary note 2, wherein an opening degree of an APC valve is adjusted while performing the step (b-2).

(Supplementary Note 4)

The method of Supplementary note 2, wherein the APC valve is closed before the inside pressure of the process chamber reaches a vacuum state.

(Supplementary Note 5)

The method of Supplementary note 3, wherein the opening/closing of an inert gas valve is interlocked with an opening degree of the APC valve while performing the step (b-2).

(Supplementary Note 6)

The method of Supplementary note 2, wherein the inside pressure of the process chamber varies along a wave form while performing the step (b-2).

(Supplementary Note 7)

The method of Supplementary note 6, wherein the inside pressure of the process chamber varies between 10 Pa and 200 Pa.

(Supplementary Note 8)

The method of Supplementary note 6, wherein a maximum value of the inside pressure of the process chamber gradually decreases as the step (b-2) is performed a plurality of times.

(Supplementary Note 9)

The method of Supplementary note 1, wherein the step (b) includes: (b-3) supplying a first source into the process chamber; (b-4) supplying the inert gas into the process chamber and exhausting the first source and the inert gas from the process chamber; (b-5) supplying a second source into the process chamber, and (b-6) supplying the inert gas into the process chamber and exhausting the second source and the inert gas from the process chamber.

(Supplementary Note 10)

The method of Supplementary note 9, wherein time taken to perform the step (b-6) is longer than time taken to perform the step (b-4).

(Supplementary Note 11)

The method of Supplementary note 9, wherein each of the steps (b-4) and (b-6) is performed a plurality of times, and the number of times that the step (b-6) is performed is greater than the number of times that the step (b-4) is performed.

(Supplementary Note 12)

The method of Supplementary note 9, wherein the step (b-5) further includes supplying a catalyst.

(Supplementary Note 13)

The method of Supplementary note 9, wherein the first source is HCDS, and the second source is $H_2O$.

(Supplementary Note 14)

According to another aspect of the present invention, there is provided a method of processing a substrate including:

(a) transferring a substrate into a process chamber;

(b) forming a film on the substrate in the process chamber; and (c) unloading the substrate from the process chamber, wherein the step (b) includes (b-1) supplying a source gas into the process chamber, and (b-2) supplying an inert gas into the process chamber while alternately increasing and decreasing a flow rate of the inert gas supplied into the process chamber and exhausting the source gas and the inert gas from the process chamber.

(Supplementary Note 15)

According to yet another aspect of the present invention, there is provided a substrate processing apparatus including:

a process chamber configured to process a substrate;

a source gas supply system configured to supply a source gas into the process chamber;

an inert gas supply system configured to supply an inert gas into the process chamber;

an exhaust system configured to exhaust an inside atmosphere of the process chamber; and a controller configured to control the source gas supply system, the inert gas supply system, and the exhaust system to supply the inert gas into the process chamber while alternately increasing and decreasing a flow rate of the inert gas supplied into the process chamber when the source gas is exhausted from the process chamber after supplying the source gas into the process chamber.

(Supplementary Note 16)

According to still another aspect of the present invention, there is provided a method of manufacturing a semiconductor device, including:

(a) transferring a substrate into a process chamber;

(b) forming a film on the substrate in the process chamber; and (c) unloading the substrate from the process chamber, wherein the step (b) includes (b-1) supplying a source gas into the process chamber and (b-2) supplying an inert gas into the process chamber and exhausting the source gas and the inert gas from the process chamber, and the step (b-2) includes alternately increasing and decreasing an opening degree of a valve installed at an exhaust pipe configured to exhaust the source gas and the inert gas from the process chamber.

What is claimed is:

1. A method of manufacturing a semiconductor device, the method comprising forming a thin film on a substrate accommodated in a process chamber by:

(a) supplying a source gas into the process chamber; and (b) supplying an inert gas into the process chamber while alternately increasing and decreasing a flow rate of the inert gas supplied into the process chamber and exhausting the source gas and the inert gas from the process chamber, wherein an inside pressure of the process chamber varies along a wave form in the step (b), and a maximum value of the inside pressure of the process chamber gradually decreases as the step (b) is performed a plurality number of times.

2. The method of claim 1, wherein the inside pressure of the process chamber varies between 10 Pa and 200 Pa.

3. The method of claim 1, wherein the step (a) comprises:

(a-1) supplying a first source gas into the process chamber; and (a-2) supplying a second source gas into the process chamber.

4. The method of claim 3, wherein the step (b) comprises:

(b-1) supplying the inert gas into the process chamber and exhausting the first source gas and the inert gas from the process chamber after performing the step (a-1); and (b-2) supplying the inert gas into the process chamber and exhausting the second source gas and the inert gas from the process chamber after performing the step (a-2).

5. The method of claim 4, wherein time taken to perform the step (b-2) is longer than time taken to perform the step (b-1).

6. The method of claim 5, wherein each of the steps (b-1) and (b-2) is performed a plurality of times, and the number of times that the step (b-1) is performed is greater than the number of times that the step (b-2) is performed.

7. The method of claim 3, wherein the step (a-2) further comprises supplying a catalyst.

8. The method of claim 1, wherein an opening degree of an APC valve is adjusted while performing the step (b).

9. The method of claim 8, wherein the APC valve is closed before an inside pressure of the process chamber reaches a vacuum state.

\* \* \* \* \*